(12) United States Patent
You et al.

(10) Patent No.: US 10,444,289 B2
(45) Date of Patent: Oct. 15, 2019

(54) METHOD AND APPARATUS FOR ESTIMATING STATE OF BATTERY

(71) Applicant: SAMSUNG ELECTRONICS CO., LTD., Suwon-si (KR)

(72) Inventors: Kaeweon You, Hwaseong-si (KR); SangDo Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 218 days.

(21) Appl. No.: 15/197,942

(22) Filed: Jun. 30, 2016

(65) Prior Publication Data
US 2017/0023649 A1 Jan. 26, 2017

(30) Foreign Application Priority Data
Jul. 21, 2015 (KR) .................. 10-2015-0102854

(51) Int. Cl.
| | |
|---|---|
| *G01R 31/36* | (2019.01) |
| *G01R 31/367* | (2019.01) |
| *G01R 31/374* | (2019.01) |
| *G01R 31/3842* | (2019.01) |
| *G01R 31/382* | (2019.01) |

(52) U.S. Cl.
CPC ......... *G01R 31/367* (2019.01); *G01R 31/374* (2019.01); *G01R 31/382* (2019.01); *G01R 31/3842* (2019.01)

(58) Field of Classification Search
CPC ............ G01R 31/3651; G01R 31/3624; G01R 31/3675; G01R 31/3606
See application file for complete search history.

(56) References Cited

U.S. PATENT DOCUMENTS

| | | | |
|---|---|---|---|
| 8,258,751 B2 | 9/2012 | Esnard | |
| 8,519,674 B2 | 8/2013 | Anderson et al. | |
| 9,693,308 B2 * | 6/2017 | Koo | ................. H04W 52/0251 |
| 10,175,302 B2 * | 1/2019 | Zhong | .................. G01R 31/367 |
| 2003/0184307 A1 * | 10/2003 | Kozlowski | ............ B60L 3/0046 |
| | | | 324/427 |
| 2009/0326841 A1 | 12/2009 | Zhang et al. | |

(Continued)

FOREIGN PATENT DOCUMENTS

| | | |
|---|---|---|
| JP | 4689756 B1 | 5/2011 |
| JP | 4845066 B1 | 12/2011 |

(Continued)

OTHER PUBLICATIONS

Hu, Xiaosong, et al., "Fuzzy Clustering based Multi-model Support Vector Regression State of Charge Estimator for Lithium-ion Battery of Electric Vehicle." 2009 International Conference on Intelligent Human-Machine Systems and Cybernetics, 2009 IEEE Computer Society, IHMSC 2009.106. (6 pages in English).

(Continued)

*Primary Examiner* — Mohammad K Islam
(74) *Attorney, Agent, or Firm* — NSIP Law

(57) ABSTRACT

A method of estimating a life of a battery includes acquiring density data based on battery sensing data, determining a density feature based on the density data using clusters generated by clustering a density data set based on a plurality of battery management profiles, and estimating the life of the battery based on the density feature.

22 Claims, 12 Drawing Sheets

(56) References Cited

U.S. PATENT DOCUMENTS

| | | | |
|---|---|---|---|
| 2011/0264381 A1* | 10/2011 | Gering | H01M 10/48 702/32 |
| 2013/0069660 A1 | 3/2013 | Bernard et al. | |
| 2013/0096858 A1* | 4/2013 | Amano | G01R 31/367 702/63 |
| 2015/0149799 A1* | 5/2015 | Ye | G06F 1/263 713/320 |
| 2016/0011274 A1* | 1/2016 | Morita | B60L 58/16 702/63 |
| 2016/0018472 A1* | 1/2016 | Sung | G01R 31/367 702/63 |
| 2016/0202324 A1* | 7/2016 | Biletska | B60L 58/12 702/63 |
| 2016/0209473 A1 | 7/2016 | You et al. | |
| 2016/0327943 A1* | 11/2016 | Lee | H02J 7/00 |
| 2016/0372935 A1* | 12/2016 | Sakata | G01R 31/36 |

FOREIGN PATENT DOCUMENTS

| | | |
|---|---|---|
| KR | 10-2010-0063343 A | 6/2010 |
| KR | 10-1065551 B1 | 9/2011 |
| KR | 10-2011-0111018 A | 10/2011 |
| KR | 10-2013-0021991 A | 3/2013 |
| KR | 10-2013-0123962 A | 11/2013 |
| WO | WO 2015/101570 A1 | 7/2015 |

OTHER PUBLICATIONS

Nuhic, Adnan, et al., "Health diagnosis and remaining useful life prognostics of lithium-ion batteries using data-driven methods." Journal of Power Sources 239 (2013): 680-688. (10 pages in English).

Extended European Search Report dated Dec. 21, 2016 in counterpart European Application No. 16155787.1. (13 pages in English).

* cited by examiner

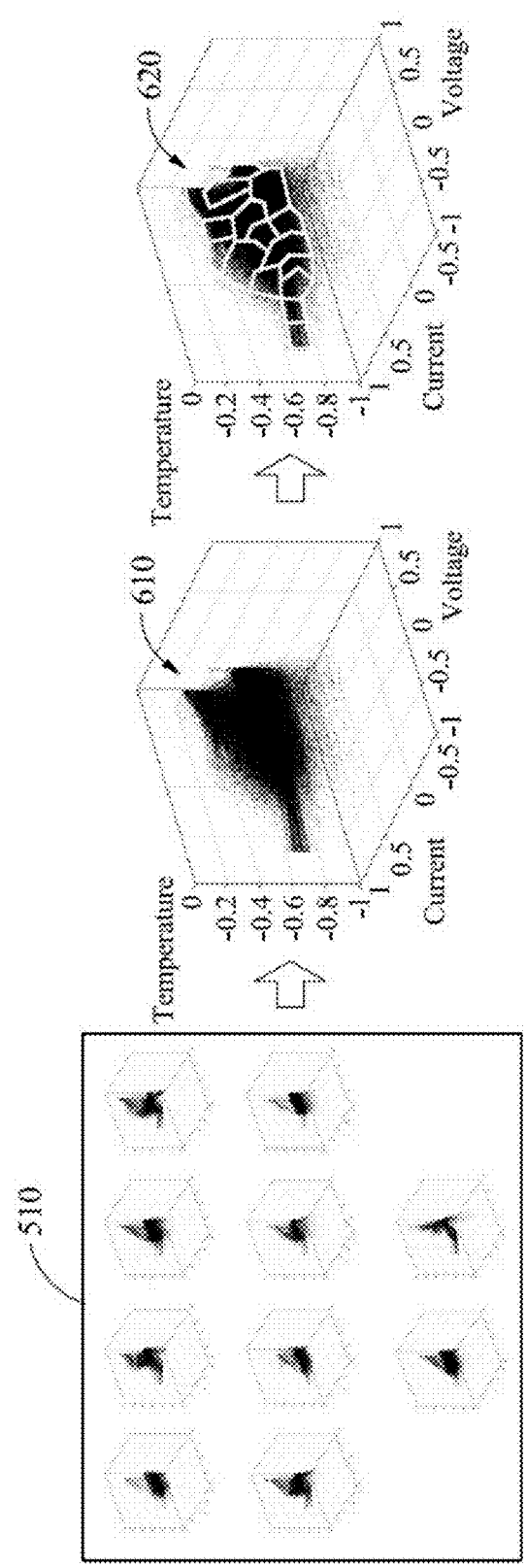

METHOD AND APPARATUS FOR ESTIMATING STATE OF BATTERY

CROSS-REFERENCE TO RELATED APPLICATION(S)

This application claims the benefit under 35 USC 119(a) of Korean Patent Application No. 10-2015-0102854 filed on Jul. 21, 2015, in the Korean Intellectual Property Office, the entire disclosure of which is incorporated herein by reference for all purposes.

BACKGROUND

1. Field

The following description relates to a method and an apparatus for estimating a state of a battery.

2. Description of Related Art

As environmental concerns and energy resource issues become more important, an electric vehicle (EV) has been highlighted as a vehicle of the future. The EV does not emit exhaust gas, and produces less noise than a gasoline-powered vehicle because a battery formed in a single pack with a plurality of rechargeable and dischargeable secondary cells is used as a main power source in the EV.

The battery functions as a fuel tank and an engine of a gasoline-powered vehicle in the EV. Thus, checking a state of the battery while the EV is in use is important. As a battery, that is, a secondary cell is frequently used, a life of the battery is reduced. Due to a reduction in the life of the battery, an initial capacity of the battery is not guaranteed and a capacity of the battery is gradually reduced. A driver desired power, operating time, and stability may not be provided when the capacity of the battery continues to decrease, and accordingly replacement of the battery may be required. Determining a state of the battery is important to determine when to replace the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of estimating a life of a battery includes acquiring density data based on battery sensing data; determining a density feature based on the density data using clusters generated by clustering a density data set based on a plurality of battery management profiles; and estimating the life of the battery based on the density feature.

The determining of the density feature may include determining the density feature based on a number of pieces of density data included in each of the clusters.

The determining of the density feature may further include determining the pieces of the density data included in each of the clusters based on a centroid of each of the clusters.

The determining may include generating a histogram based on a number of pieces of density data included in each of the clusters; and determining a density vector based on the histogram.

The determining may include converting the density data to a density vector based on the clusters.

The acquiring may include combining different types of battery sensing data sensed at the same point in time; and acquiring the density data by accumulating the combined battery sensing data over time.

The density data may be data representing a spatial distribution of battery sensing data over time.

The battery sensing data may include any one or any combination of any two or more of voltage data, current data, and temperature data of the battery.

The density data set may be a combination of density data based on the plurality of battery management profiles.

The estimating may include estimating the life of the battery from the density feature using a battery life estimation model; and the battery life estimation model may be based on any one of a neural network (NN) model, a support vector machine (SVM) model, and a Gaussian process regression (GPR) model.

In another general aspect, a non-transitory computer-readable storage medium stores instructions that, when executed by a processor, cause the processor to perform the method described above.

In another general aspect a method of training a battery life estimation model includes acquiring a density data set by combining density data acquired based on battery sensing data; clustering the density data in the density data set into a plurality of clusters; determining a density feature based on training data using the clusters; and training the battery life estimation model based on the density feature.

The determining of the density feature may include determining the density feature based on a number of pieces of density data constituting training data included in each of the clusters.

The determining of the density feature may further include determining the pieces of the training data included in each of the clusters based on a centroid of each of the clusters.

The determining may include generating a histogram based on a number of pieces of density data constituting training data included in each of the clusters; and determining a density vector based on the histogram.

The method may further include storing information on the clusters and information on the trained battery life estimation model.

The method may further include normalizing the density data set; and the clustering may include clustering density data constituting training data in the normalized density data set into the plurality of clusters.

The acquiring may include acquiring density data based on a plurality of battery management profiles; and acquiring the density data set by combining the acquired density data.

The acquiring may include combining different types of battery sensing data sensed at the same point in time; and accumulating the combined battery sensing data over time.

In another general aspect, an apparatus for estimating a life of a battery includes a density data acquirer configured to acquire density data based on battery sensing data; a density feature determiner configured to determine a density feature based on the density data using clusters generated by clustering a density data set based on a plurality of battery management profiles; and a battery life estimator configured to estimate the life of the battery based on the density feature.

In another general aspect, an apparatus for estimating a life of a battery includes a memory configured to store computer-readable instructions; and a processor configured to execute the computer-readable instructions to configure the processor to acquire battery sensing data, convert the battery sensing data into spatial data, determine a spatial feature based on the spatial data, and estimate the life of the battery based on the spatial feature.

The processor may be further configured to project the battery sensing data onto a space having a predetermined dimension to obtain the spatial data.

The processor may be further configured to acquire the battery sensing data over a period of time; the battery sensing data may include N types of battery data sensed from the battery; the space may be an N-dimensional space; and each of the N types of battery data may be projected onto to a corresponding dimension of the N-dimensional space.

The spatial data may be density data indicating a density distribution of the battery sensing data in a space having a predetermined dimension; and the processor may be further configured to cluster the density data into clusters in the space based on a plurality of battery management profiles, and determine the spatial feature based on the clusters.

Each of the clusters may contain all pieces of the density data that are closer to a centroid of the cluster than to a centroid of any other one of the clusters.

The processor may be further configured to count a number of the pieces of the density data in each of the clusters, determine a density vector as the spatial feature based on the number of the pieces of the density data in each of the clusters, and estimate the life of the battery based on the density vector.

The density vector may include elements respectively corresponding to the clusters; and each of the elements may be the numbers of pieces of the density data in a respective one of the clusters.

Other features and aspects will be apparent from the following detailed description, the drawings, and the claims.

BRIEF DESCRIPTION OF THE DRAWINGS

FIG. 6 illustrates an example of a process of acquiring a density data set and clustering the density data set.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
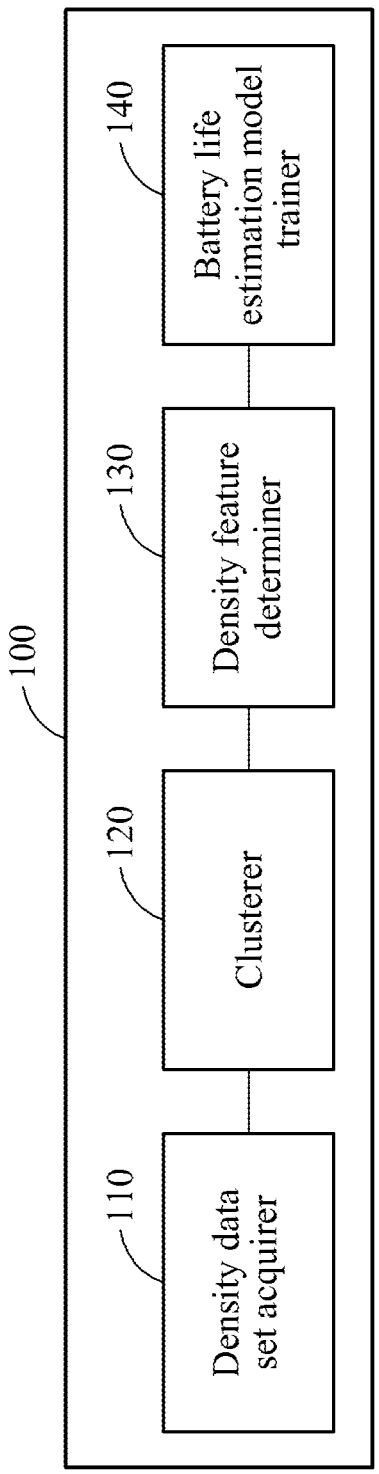
FIG. 1 illustrates an example of a configuration of a training apparatus for training a battery life estimation model.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Reference throughout the present specification to "one example" or "an example" indicates that a particular feature, structure, or characteristic described in connection with the example is included in at least one example. Thus, appearances of the phrases "one example" and "an example" in various places throughout the present specification are not necessarily all referring to the same example.

The terminology used herein is for the purpose of describing particular examples only, and is not intended to limit the disclosure. As used herein, the singular forms "a," "an," and "the" are intended to include the plural forms as well, unless the context clearly indicates otherwise. As used herein, the terms "include," "comprise," and "have" specify the presence of stated features, numbers, operations, elements, components, or combinations thereof, but do not preclude the presence or addition of one or more other features, numbers, operations, elements, components, or combinations thereof.

In the following description, a battery included in an electric vehicle (EV) is merely an example for convenience of description, but the scope of the examples is not limited to an EV. Rather, the examples are applicable to all applications employing rechargeable and dischargeable secondary batteries.

As a number of cycles of charging and discharging a battery increases, the battery ages, and accordingly a life of the battery is reduced. The life of the battery is a period of time during which the battery normally supplies power to an external apparatus. The life of the battery corresponds to, for example, a current capacity value of the battery, an internal resistance value of the battery, or a state of health (SOH) of the battery. For example, when a capacity of a battery, that is, a maximum amount of charge that can be stored in the battery is reduced below a threshold, the battery may need to be replaced because the battery does not satisfy a requirement for an application. Accordingly, accurately estimating a state of the battery is important to determine when to replace the battery.

FIG. 1 illustrates an example of a configuration of a training apparatus 100 for training a battery life estimation model. The training apparatus 100 trains the battery life estimation model. The training apparatus 100 collects sensing data of a battery, and trains the battery life estimation model based on a density of the collected sensing data. The battery life estimation model is used to estimate a life of the battery when the training is completed. Hereinafter, an operation of the training apparatus 100 will be further described.

Referring to FIG. 1, the training apparatus 100 includes a density data set acquirer 110, a clusterer 120, a density feature determiner 130, and a battery life estimation model trainer 140. The density data set acquirer 110, the clusterer 120, the density feature determiner 130, and the battery life estimation model trainer 140 may be implemented by at least one processor.

The density data set acquirer 110 acquires density data based on battery sensing data, and acquires a density data set from density data acquired in various battery management situations. The density data represents a degree to which collected battery sensing data is distributed in a two-dimensional (2D) space or a three-dimensional (3D) space, and the density data set is a set of pieces of density data.

The density data set acquirer 110 collects different types of battery sensing data and acquires density data based on the collected battery sensing data. For example, the density data set acquirer 110 collects voltage data, current data, and temperature data of the battery, projects voltage data, current data, and temperature data that are sensed at the same point in time (for example, having the same timestamp) onto a 3D space, and acquires density data from the projected data.

The density data set acquirer 110 acquires density data based on various battery management profiles, and acquires a density data set by combining the acquired density data. Data adjacent to each other in a region represented by the density data set have similar influences on aging of a battery.

Patterns of density data vary depending on a battery management profile. For example, a battery management profile in an example in which an EV travels in a city is different from a battery management profile in an example in which the EV travels on a highway, and accordingly patterns of battery sensing data are different from each other in these two examples. Thus, patterns of density data based on the battery sensing data may be determined based on a battery management profile. The density data set acquirer 110 generates a density data set by combining the density data in various patterns.

The clusterer 120 clusters the density data in the density data set into a plurality of clusters. Through the clustering, the entire region represented by the density data set is partitioned into a plurality of sub-regions, and each of the sub-regions corresponds to a single cluster.

The clusterer 120 partitions the region represented by the density data set into a plurality of clusters using various clustering schemes, for example, a k-means clustering scheme. Each of the clusters has a centroid, and data (for example, data of the density data set) included in a cluster is closer to a centroid of the cluster than a centroid of each of the other clusters. Cluster information including information on a centroid of each of the clusters is stored in a storage (not shown). The stored cluster information is used both in a process of training a battery life estimation model and a process of estimating a life of a battery.

In addition, the clusterer 120 normalizes a distribution of the density data set prior to the clustering. For example, the clusterer 120 adjusts a difference in scale between different types of battery sensing data in the density data set. Through the normalizing, a density of the density data set may be prevented from being biased in a predetermined direction due to the difference in the scale between the battery sensing data.

The density feature determiner 130 determines a density feature based on training data. The training data includes, for example, density data generated based on battery sensing data in a predetermined time interval. For example, the density feature determiner 130 uses, as training data, density data acquired by projecting voltage data, current data, and temperature data of the battery that are sensed at the same point in time onto a space of a predetermined dimension. The density data may be generated based on battery sensing data collected during a period of time from an initial point in time to a predetermined point in time.

The density feature determiner 130 quantifies a density pattern of the training data based on the clusters determined by the clusterer 120. The density feature determiner 130 counts pieces of training data included in each of the clusters, and quantifies a density pattern of the training data. For example, the density feature determiner 130 generates a histogram by counting pieces of data included in each of the clusters, and determines a density feature based on information on the generated histogram. The density feature determiner 130 determines, as a density feature, a density vector obtained by vectorizing a number of pieces of data included in each of the clusters.

The battery life estimation model trainer 140 trains the battery life estimation model based on the density feature. When a target output value corresponding to training data is given, the battery life estimation model trainer 140 trains parameters of the battery life estimation model so that the target output value is output from the battery life estimation model. Through the training, the parameters of the battery life estimation model are updated to output a battery life value given based on a density feature input to the battery life estimation model.

The battery life estimation model includes a black-box function, and the battery life estimation model trainer 140 trains parameters of the black-box function based on a given input and output of the black-box function. The battery life estimation model includes, for example, a neural network (NN) model, a support vector machine (SVM) model, or a Gaussian process regression (GPR) model, but a learning model used as a battery life estimation model is not limited thereto. Accordingly, various other learning models known to one of ordinary skill in the art may be used as a battery life estimation model.

In one example, when the NN model is used as a battery life estimation model, a learning parameter includes activation functions, weights, and a connection pattern between artificial neurons. In another example, when the SVM model is used as a battery life estimation model, a learning parameter includes a kernel function and penalty parameters. In still another example, when the GPR model is used as a battery life estimation model, a learning parameter includes a kernel function and hyperparameters.

The battery life estimation model trainer 140 trains the battery life estimation model based on a variety of training data, and stores parameter information of the completely trained battery life estimation model in the storage. The stored parameter information is used to estimate the life of the battery.

Figure 2:
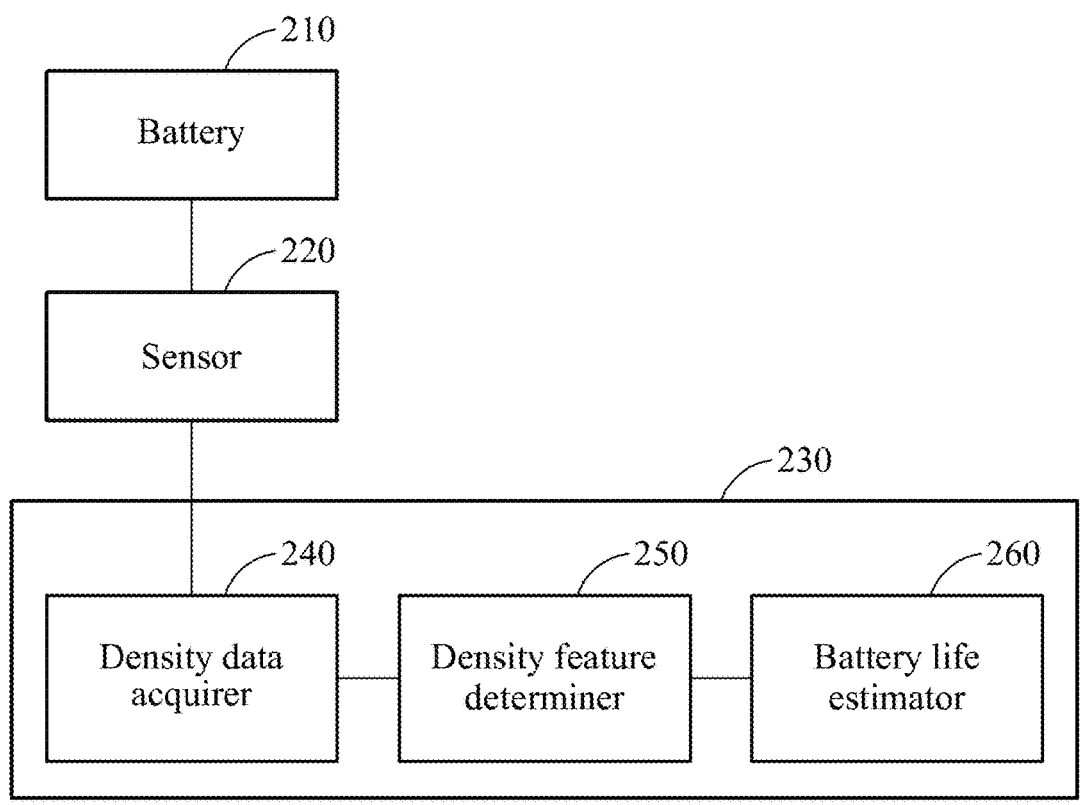
FIG. 2 illustrates an example of a configuration of a battery life estimation apparatus for estimating a life of a battery.

FIG. 2 illustrates an example of a configuration of a battery life estimation apparatus 230. The battery life estimation apparatus 230 estimates a life of a battery 210 or a current aging state of the battery 210. The battery life estimation apparatus 230 collects sensing data of the battery 210, analyzes a density of the collected sensing data, and estimates, in real time, a life of the battery 210. To estimate the life of the battery 210, information on each of clusters determined by the training apparatus 100 of FIG. 1 and the battery life estimation model trained by the training apparatus 100 are used. Hereinafter, an operation of the battery life estimation apparatus 230 will be further described.

Referring to FIG. 2, the battery life estimation apparatus 230 includes a density data acquirer 240, a density feature determiner 250, and a battery life estimator 260. The density data acquirer 240, the density feature determiner 250, and the battery life estimator 260 may be implemented by at least one processor.

The sensor 220 acquires battery sensing data. The battery sensing data includes, for example, any one or any combination of any two or more of voltage data, current data, and temperature data of the battery 210. Also, the battery sensing data may include either one or both of pressure data acquired from a pressure sensor and humidity data acquired from a humidity sensor. The battery sensing data is, for example, time-series data sensed during a predetermined time interval. In FIG. 2, the sensor 220 is separate from the battery life estimation apparatus 230. However, depending on the implementation, the sensor 220 may be included in the battery life estimation apparatus 230.

The density data acquirer 240 acquires density data based on different types of battery sensing data. For example, the density data acquirer 240 projects voltage data, current data, and temperature data of the battery 210 that are sensed at the same point in time within a predetermined time interval onto a space of a predetermined dimension, and generates density data from the projected data. Each piece of data projected onto the space is represented as a point.

The density feature determiner 250 determines a density feature based on the density data. The density feature determiner 250 quantifies a density pattern of the density data based on cluster information determined during training of a battery life estimation model. The density feature determiner 250 determines a density for each of clusters based on information on the clusters, and determines a density vector representing a density feature of density data based on the determined density. The information on the clusters is stored in advance.

For example, the density feature determiner 250 counts pieces of density data included in each of the clusters, and determines a density vector as the density feature based on count values obtained by the counting for each of the clusters. Each piece of the density data is represented as a point located at a predetermined spatial location. The density feature determiner 250 calculates a distance between a point and a centroid of each of the clusters, and determines that the point is included in a cluster having a centroid that is a shortest distance from the point. The density feature determiner 250 repeatedly performs the above process on all the pieces of the density data, and counts pieces of density data included in each of the clusters. The density feature determiner 250 determines a density vector as the density feature based on count values obtained by the counting for each of the clusters.

The battery life estimator 260 estimates the life of the battery 210 based on the density feature. The battery life estimator 260 inputs the density feature to a battery life estimation model, and estimates a current life of the battery 210. The battery life estimation model is trained during the training process of FIG. 1.

For example, the battery life estimator 260 forms a battery life estimation model based on parameter information of a trained battery life estimation model. The battery life estimation model is used to predict the life of the battery 210 based on a density feature represented as, for example, a density vector, and to output the predicted life. Information on the life of the battery 210 may be provided to a user through an interface or may be stored in a storage (not shown).

Through the above process, the battery life estimation apparatus 230 estimates the life of the battery 210 in real time based on battery sensing data, or estimates the life of the battery 210 even though the battery 210 is partially charged. Also, the battery life estimation apparatus 230 estimates the life of the battery 210 based on different types of battery sensing data that are correlated to each other, regardless of predetermined battery sensing data. The life of the battery 210 is estimated based on battery sensing data collected during a predetermined time interval and the estimated life of the battery 210 may be recorded, and thus it is possible to easily manage a history of a battery management.

Figure 3:
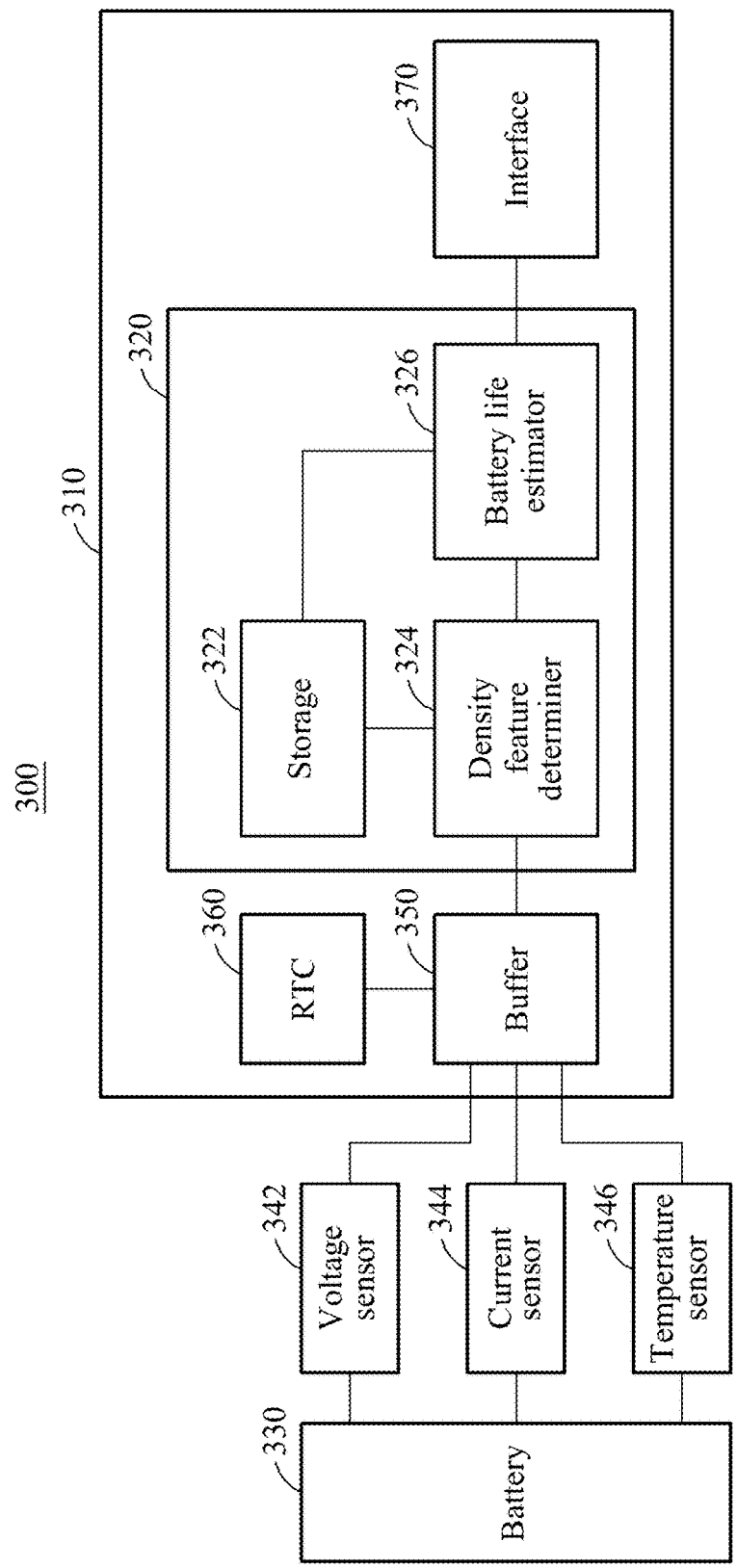
FIG. 3 illustrates an example of a configuration of a battery system for estimating a life of a battery.

FIG. 3 illustrates an example of a configuration of a battery system 300 for estimating a life of a battery. Referring to FIG. 3, the battery system 300 includes a battery 330, a voltage sensor 342, a current sensor 344, a temperature sensor 346, and a battery control apparatus 310. In FIG. 3, the voltage sensor 342, the current sensor 344, and the temperature sensor 346 are separate from the battery control apparatus 310, but this is merely an example. Depending on the implementation, any one or any combination of any two or more of the voltage sensor 342, the current sensor 344, and the temperature sensor 346 may be included in the battery control apparatus 310.

The battery 330 supplies power to an apparatus, a device, or a machine including the battery 330, and includes a plurality of battery modules. Capacities of the plurality of battery modules may be the same as or different from each other.

The voltage sensor 342 senses a voltage of the battery 330 and acquires voltage data, the current sensor 344 senses a current of the battery 330 and acquires current data, and the temperature sensor 346 senses a temperature of the battery 330 and acquires temperature data. The voltage sensor 342, the current sensor 344, and the temperature sensor 346 measure a state of the battery 330 in real time.

The battery control apparatus 310 includes a buffer 350, a real time clock (RTC) 360, a battery life estimation apparatus 320, and an interface 370. The buffer 350 stores battery sensing data received from the voltage sensor 342, the current sensor 344, and the temperature sensor 346. The RTC 360 keeps a current time and provides time information to the buffer 350. The buffer 350 records a time at which the battery sensing data is received from the voltage sensor 342, the current sensor 344, and the temperature sensor 346 based on the time information received from the RTC 360.

The battery life estimation apparatus 320 includes a storage 322, a density feature determiner 324, and a battery life estimator 326. The storage 322 stores information on clusters determined during training of a battery life estimation model and parameter information of a trained battery life estimation model. The information on the clusters includes information on a centroid of each of the clusters. The storage 322 may be, for example, a dynamic random access memory (DRAM), a static RAM (SRAM), a ferroelectric RAM (FRAM), a flash memory, a hard disk drive (HDD), or a solid state drive (SSD), but these are merely examples, and any type of storage known to one of ordinary skill in the art may be used as the storage 322.

The density feature determiner 324 generates density data from different types of battery sensing data. The density feature determiner 324 quantifies a density of the battery sensing data for each of the clusters based on the information on the clusters stored in storage 322. For example, the density feature determiner 324 counts pieces of density data included in each of the clusters and determines a density vector corresponding to the density data based on a result of the counting.

The battery life estimator 326 estimates a life of the battery 330 based on a density feature represented as, for example, a density vector. The battery life estimator 326 inputs a density feature to a trained battery life estimation model, and estimates the life of the battery 330. For example, when an NN model is used as a battery life estimation model, the battery life estimator 326 applies parameter information of the NN model stored in the storage 322 to the battery life estimation model. The battery life estimation model outputs an estimate of the life of the battery 330 based on the input density feature.

The interface 370 transmits information on the estimated life of the battery 330 to another apparatus or displays the information on the estimated life on a display apparatus.

Figure 4:
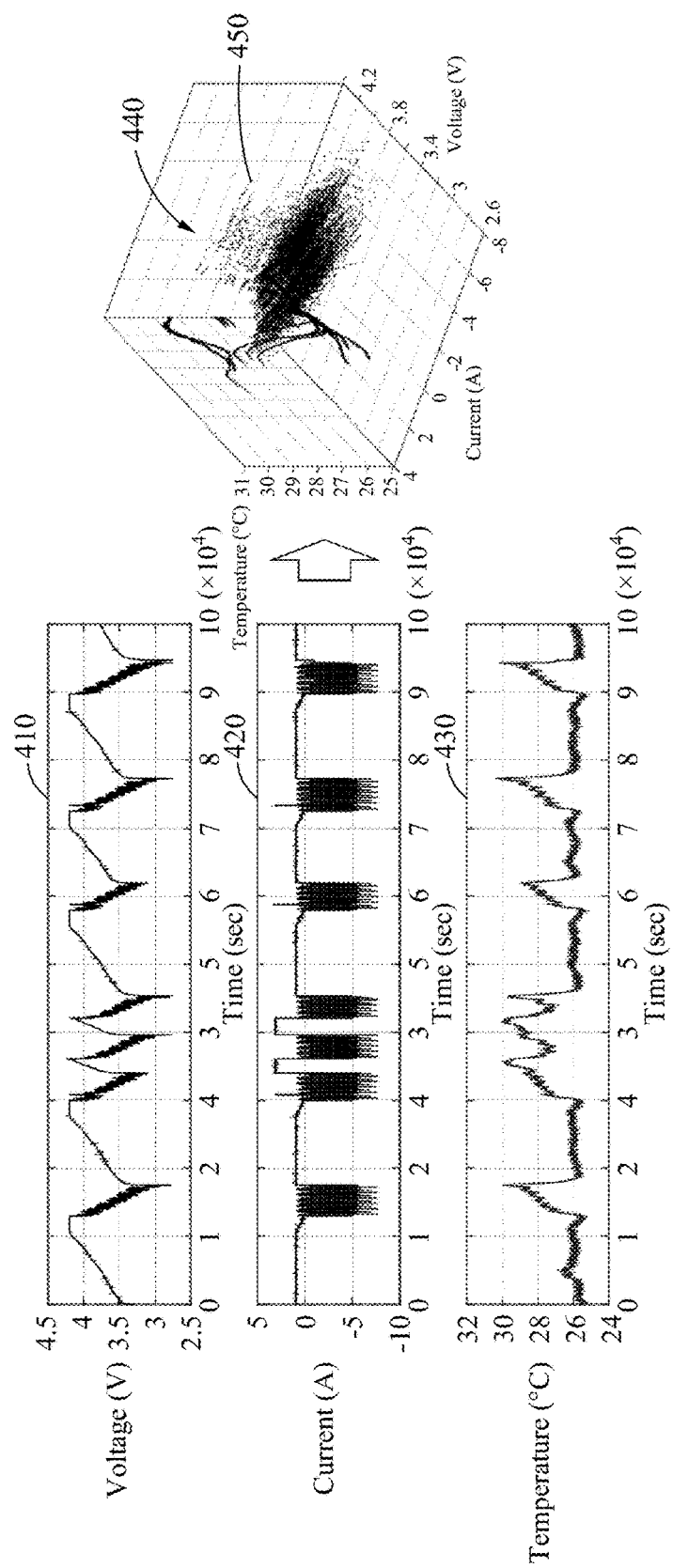
FIG. 4 illustrates an example of a process of acquiring density data based on battery sensing data.

FIG. 4 illustrates an example of a process of acquiring density data based on battery sensing data. Both the training apparatus 100 of FIG. 1 and the battery life estimation apparatus 230 of FIG. 2 acquire density data based on battery sensing data.

In FIG. 4, battery sensing data is sensed over time when charging and discharging of a battery are repeated. A graph 410 shows a change in a voltage of the battery over time, a graph 420 shows a change in a current of the battery over time, and a graph 430 shows a change in a temperature of the battery over time. In the graphs 410 through 430, an X-axis represents time.

Different types of battery sensing data sensed from the battery are correlated with each other. When the battery sensing data is analyzed based on the graphs 410 through 430, the current has a negative value, a value of the voltage decreases, and a value of the temperature increases during discharging of the battery. During charging of the battery, the current has a positive value, a value of the voltage increases, and a value of the temperature decreases.

The battery sensing data is represented in the form of density data 440 projected onto a 3D space, instead of being independently processed. The density data 440 is acquired by expressing voltage data, current data, and temperature data of the battery sensed at a predetermined timestamp as 3D data $V_t$, $I_t$, and $T_t$, and projecting the voltage data, the current data, and the temperature data onto a 3D space. The 3D data $V_t$, $I_t$, and $T_t$ denote a voltage value, a current value, and a temperature value of the battery sensed at a point in time t, respectively. Each of points 450 included in the density data 440 indicates battery sensing data sensed at a predetermined timestamp and projected onto the 3D space. The points 450 include voltage information, current information, and temperature information of the battery sensed at the same point in time. Because the battery sensing data continues to be accumulated, a number of points included in the density data 440 increases over time.

Generating of the density data based on three types of battery sensing data, that is, the voltage, the current, and the temperature has been described with reference to FIG. 4, but this is merely one example. Depending on the implementation, density data may be generated based on two types of sensing data, or four or more types of sensing data. In one example, density data may be generated based on voltage data and current data of a battery. In another example, density data may be generated based on voltage data, current data, and temperature data, and acceleration data that is measured by an acceleration sensor.

Figure 5:
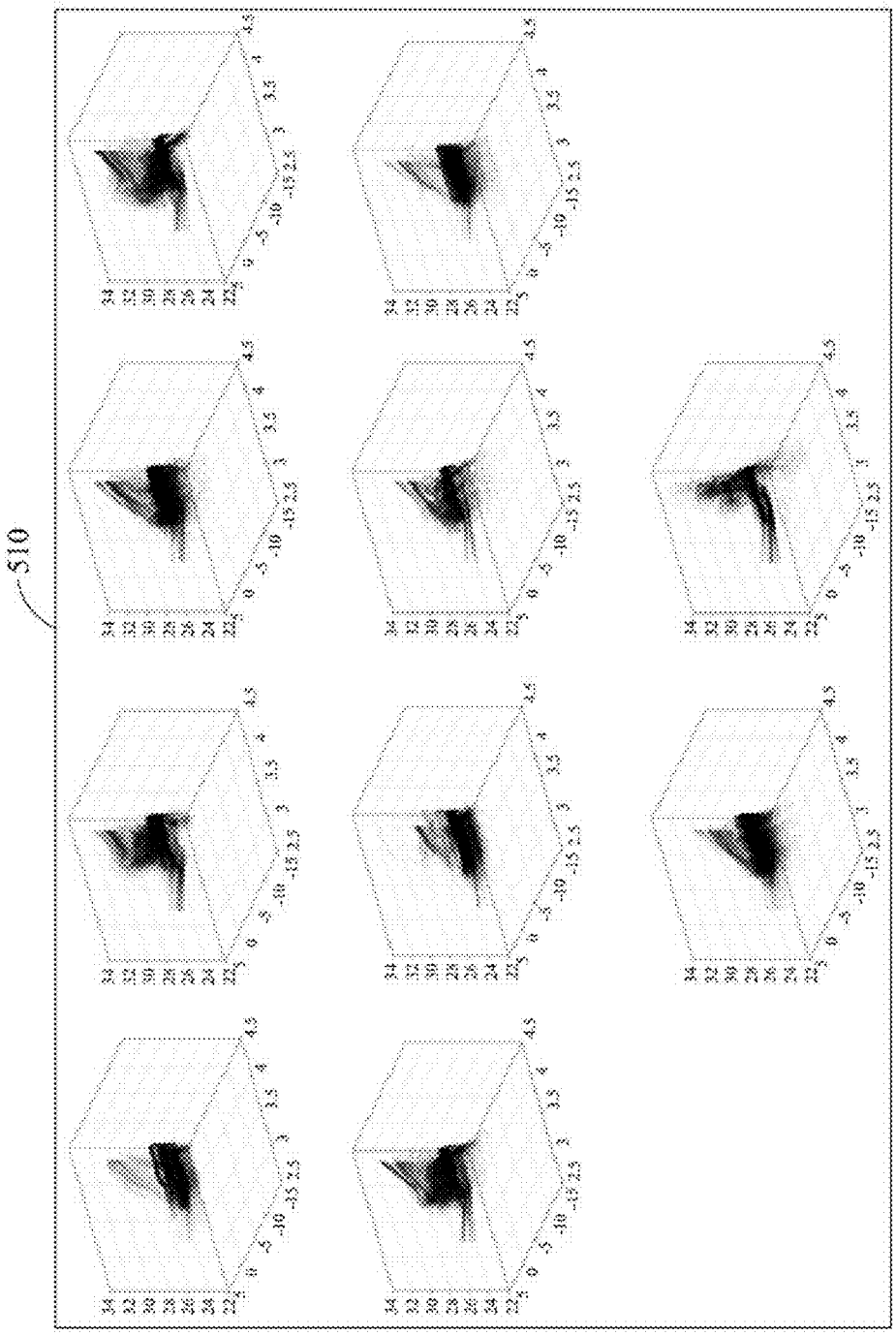
FIG. 5 illustrates an example of density data.

FIG. 5 illustrates an example of density data. In FIG. 5, density data 510 is generated based on various battery management profiles. The battery management profiles are used to sense a change in a characteristic of a battery (for example, a life of the battery) when charging and discharging of the battery are continuously performed in a given battery management environment.

A density of the battery sensing data varies depending on a battery management profile which may be associated with aging of the battery. For example, a battery management profile in an example in which an EV travels in a city is different from a battery management profile in an example in which the EV travels on a highway, which may lead to a difference in density data based on the battery sensing data and a difference in a battery capacity reduction pattern. The training apparatus 100 of FIG. 1 collects battery sensing data based on various battery management profiles, and acquires density data in various battery management environments based on the collected battery sensing data.

FIG. 6 illustrates an example of a process of acquiring a density data set and clustering density data in the density data set, in accordance with an embodiment.

Referring to FIG. 6, the training apparatus 100 of FIG. 1 collects density data 510 based on various battery management profiles, and generates a density data set 610 by combining the collected density data 510. The training apparatus 100 clusters the density data set 610 into a plurality of clusters. Through the clustering, an entire region represented by the density data set 610 is partitioned into a plurality of sub-regions. A single sub-region corresponds to a single cluster.

The training apparatus 100 normalizes a distribution of the density data set 610 based on each axis prior to clustering. Through the normalizing, data included in the density data set 610 are prevented from being biased toward a predetermined axis due to a difference in scale between different types of battery sensing data. The training apparatus 100 partitions the density data set 610 on which the normalizing has been performed into a plurality of clusters.

The training apparatus 100 partitions the density data set 610 into a plurality of clusters using various clustering schemes, for example, a k-means clustering scheme. FIG. 6 illustrates a density data set 620 partitioned into a plurality of clusters through the clustering. In FIG. 6, the density data set 610 is assumed to be partitioned into 50 clusters using the k-means clustering scheme. For example, a point included in a cluster region is located closest to a centroid of the cluster region among centroids of all the clusters.

When the clustering is performed, the training apparatus 100 stores cluster information including position information of a centroid of each of the clusters in a storage. For example, when the density data set 610 is partitioned into 50 clusters, the training apparatus 100 stores cluster information including position information of a centroid of each of the 50 clusters. The stored cluster information is used to determine a density feature during estimating of a life of a battery.

Figure 7A:
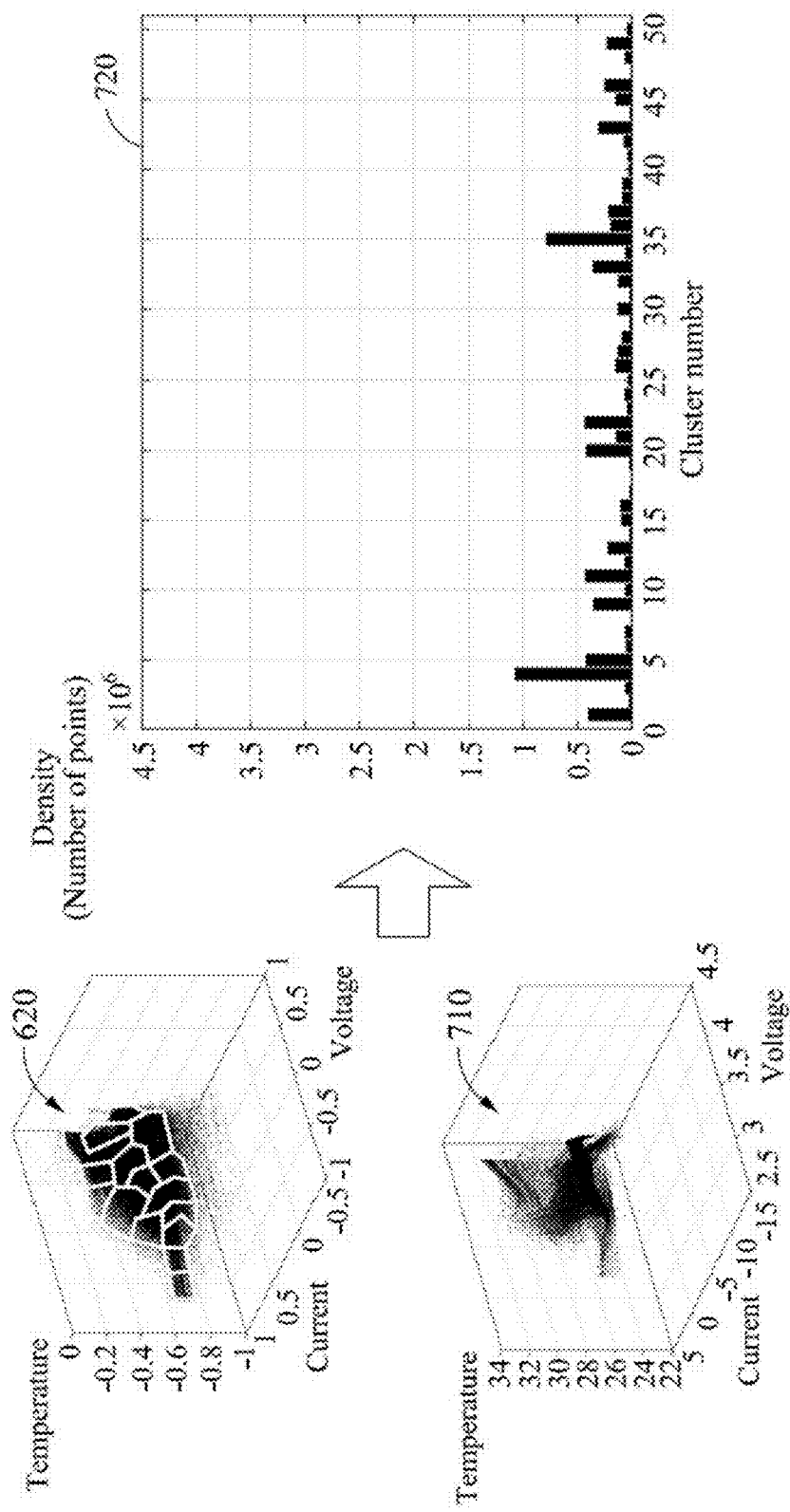
FIGS. 7A and 7B illustrate examples of a process of determining a density feature.
Figure 7B:
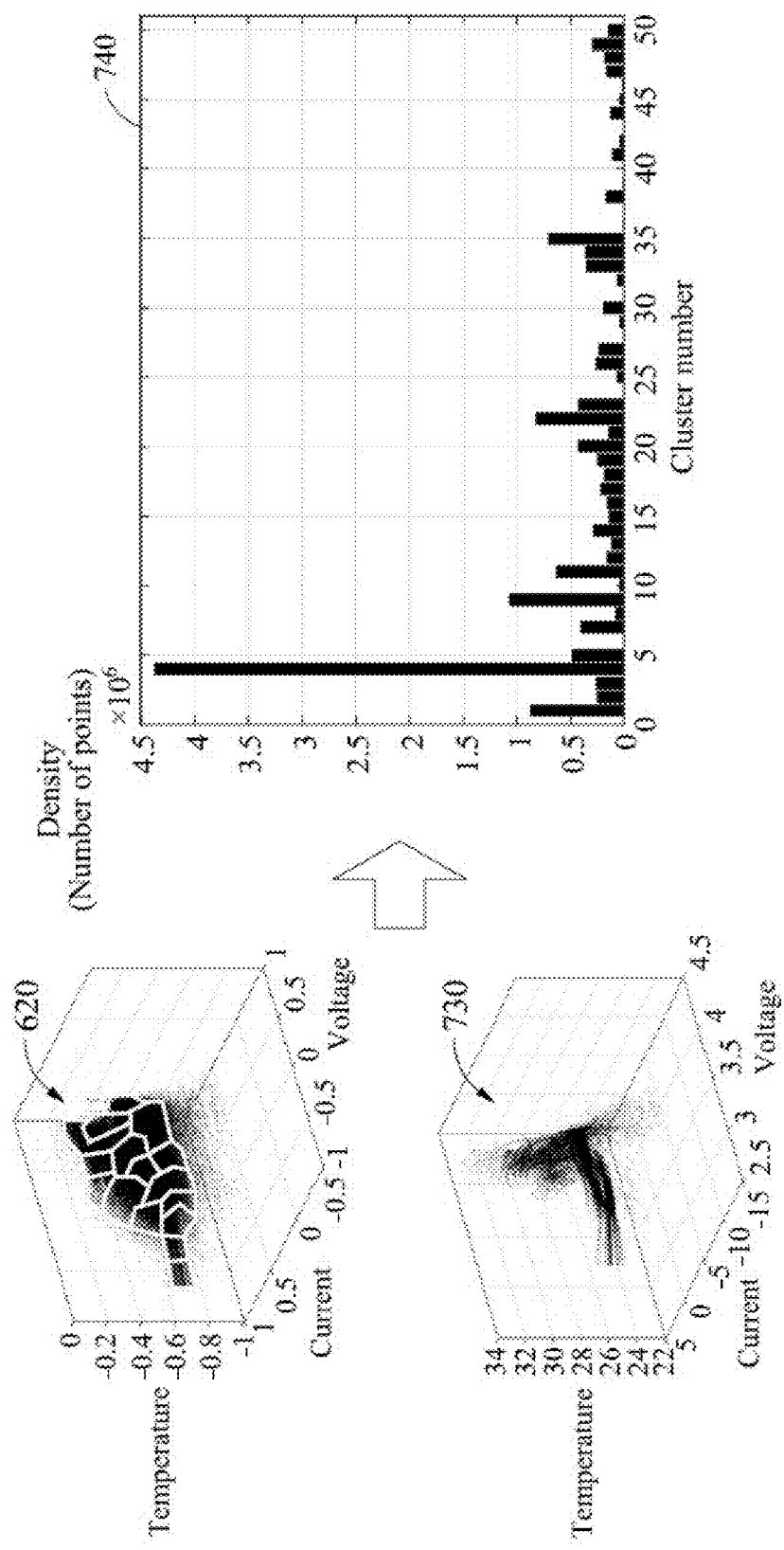

FIGS. 7A and 7B illustrate examples of a process of determining a density feature.

Referring to FIG. 7A, the training apparatus 100 of FIG. 1 acquires density data based on battery sensing data measured during a predetermined time interval, and uses the acquired density data as training data 710. The training apparatus 100 determines a density feature corresponding to the training data 710 based on the training data 710 and the density data set 620 partitioned into the plurality of clusters through the clustering in FIG. 6.

The training apparatus 100 quantifies the training data 710 by counting pieces of training data 710 included in each of the clusters. For example, a piece of the training data 710 is represented as a point p ($V_t$, $I_t$, $T_t$), the training apparatus 100 calculates a distance between the point p and each of centroids of the clusters, and determines that a cluster located a shortest distance from the point p includes the point p.

The training apparatus 100 represents a distribution of a result of the counting as a histogram 720. The histogram 720 includes information on a number of pieces of training data 710 included in each of the clusters. A size of each bin of the histogram 720 indicates the number of the pieces of the training data 710 included in each of the clusters. The training apparatus 100 determines a density feature based on the number of the pieces of the training data 710 included in each of the clusters.

For example, the training apparatus 100 determines a density vector including, as elements, the numbers of the pieces of the training data 710 included in the clusters. When 50 clusters are generated through a clustering process, the training apparatus 100 quantifies a number of pieces of training data 710 included in each of the 50 clusters, and determines a 50-dimensional density vector in which each of the elements is the number of the pieces of the training data 710 included in a corresponding one of the clusters. For example, the density vector is represented as shown in Equation 1 below.

$$V_t = (v_1^t, v_2^t, \ldots, v_i^t, \ldots, v_{50}^t) \qquad \text{[Equation 1]}$$

In Equation 1, $V_t$ denotes a density vector, and $v_i^t$ denotes the number of pieces of data included in an i-th cluster during a predetermined time interval from 0 to a time t.

The training apparatus 100 trains a battery life estimation model based on the determined density vector. The battery life estimation model is used to estimate a life of a battery. The training apparatus 100 trains the battery life estimation model based on training data collected in various battery management states and an actual measurement value of a life of a battery corresponding to the training data. The actual measurement value is acquired, for example, by measuring a capacity of a battery reduced by periodically fully charging and discharging the battery, or by measuring an increased internal resistance of the battery.

The training apparatus 100 inputs the density vector determined based on the training data 710 to the battery life estimation model, and trains the battery life estimation model to reduce a difference between a result value output from the battery life estimation model and the actual measurement value (or a desired result value). Through the training, parameters of the battery life estimation model are optimized.

For example, when the NN model is used as a battery life estimation model, the training apparatus 100 may train the battery life estimation model using an error backpropagation learning scheme. The error backpropagation learning scheme is a scheme of estimating an error by a forward computation of training data, propagating the estimated error backwards from an output layer of the NN model to a hidden layer and an input layer of the NN model, and updating connection weights between artificial neurons to reduce an error.

The battery life estimation model trained as described above and parameter information of the battery life estimation model are included in the battery life estimation apparatus 230 of FIG. 2. For example, while an EV operates, the battery life estimation apparatus 230 estimates, in real time, a life of a battery in the EV based on battery sensing data sensed from the battery.

The battery life estimation apparatus 230 generates density data based on sensing data sensed from a battery, quantifies a number of pieces (or a number of elements) of density data included in each of determined clusters, and determines a density feature from the clusters of density data. The above description of determining the density feature based on the training data 710 is also applicable to a process of determining a density feature based on the density data generated by the battery life estimation apparatus 230, and accordingly is not repeated here.

FIG. 7B illustrates an example of determining a density feature by quantifying training data 730 acquired based on a battery management profile different from the battery management profile of FIG. 7A. Similarly to FIG. 7A, the training apparatus 100 acquires a histogram 740 based on the training data 730 and the density data set 620. A density feature is determined based on a battery management profile.

Figure 8:
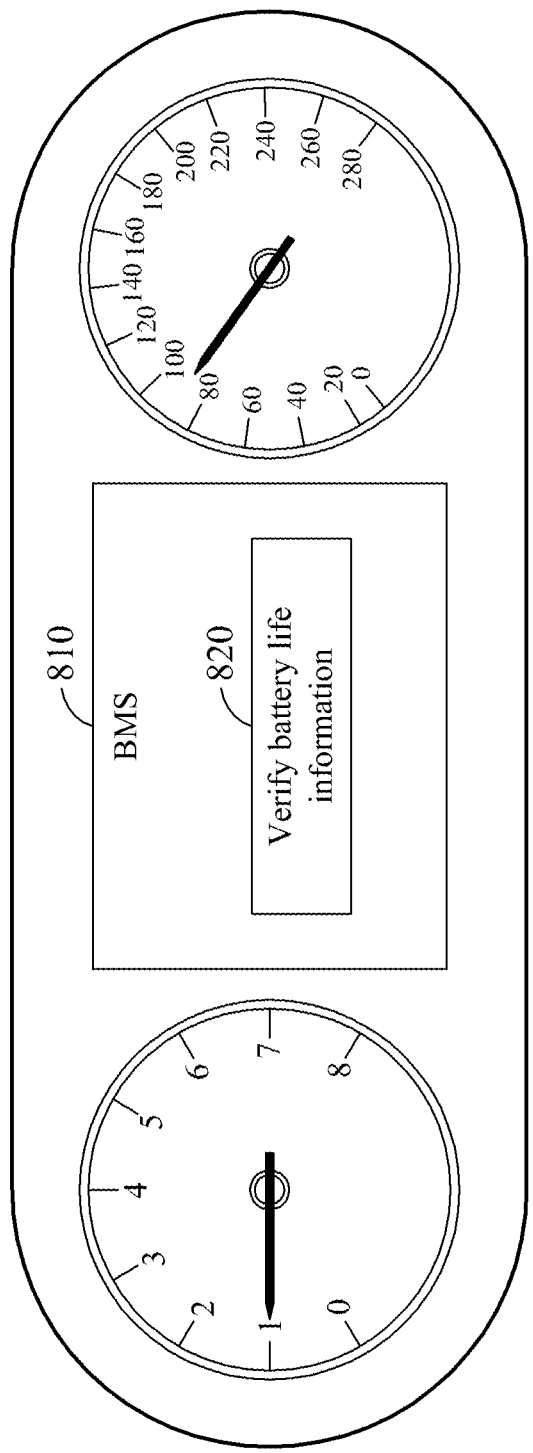
FIG. 8 illustrates an example of a user interface.

FIG. 8 illustrates an example of a user interface.

Referring to FIG. 8, a battery control apparatus receives a trigger signal from an external apparatus, and acquires battery sensing data in response to the trigger signal. Accordingly, the battery control apparatus estimates an end of life (EOL) of a battery in real time even though the battery is only partially charged and discharged. For example, when an ignition of an EV including the battery and the battery control apparatus is turned on, an electronic control unit (ECU) of the EV displays a user interface 810 on a dashboard. The user interface 810 includes an interface 820 configured to generate a trigger signal. When a user selects the interface 820, the ECU transmits a trigger signal to the battery control apparatus. The battery control apparatus estimates the EOL of the battery based on the battery sensing data. The battery control apparatus transmits the estimated EOL to the ECU. The ECU controls the user interface to display the EOL received from the battery control apparatus.

Figure 9:
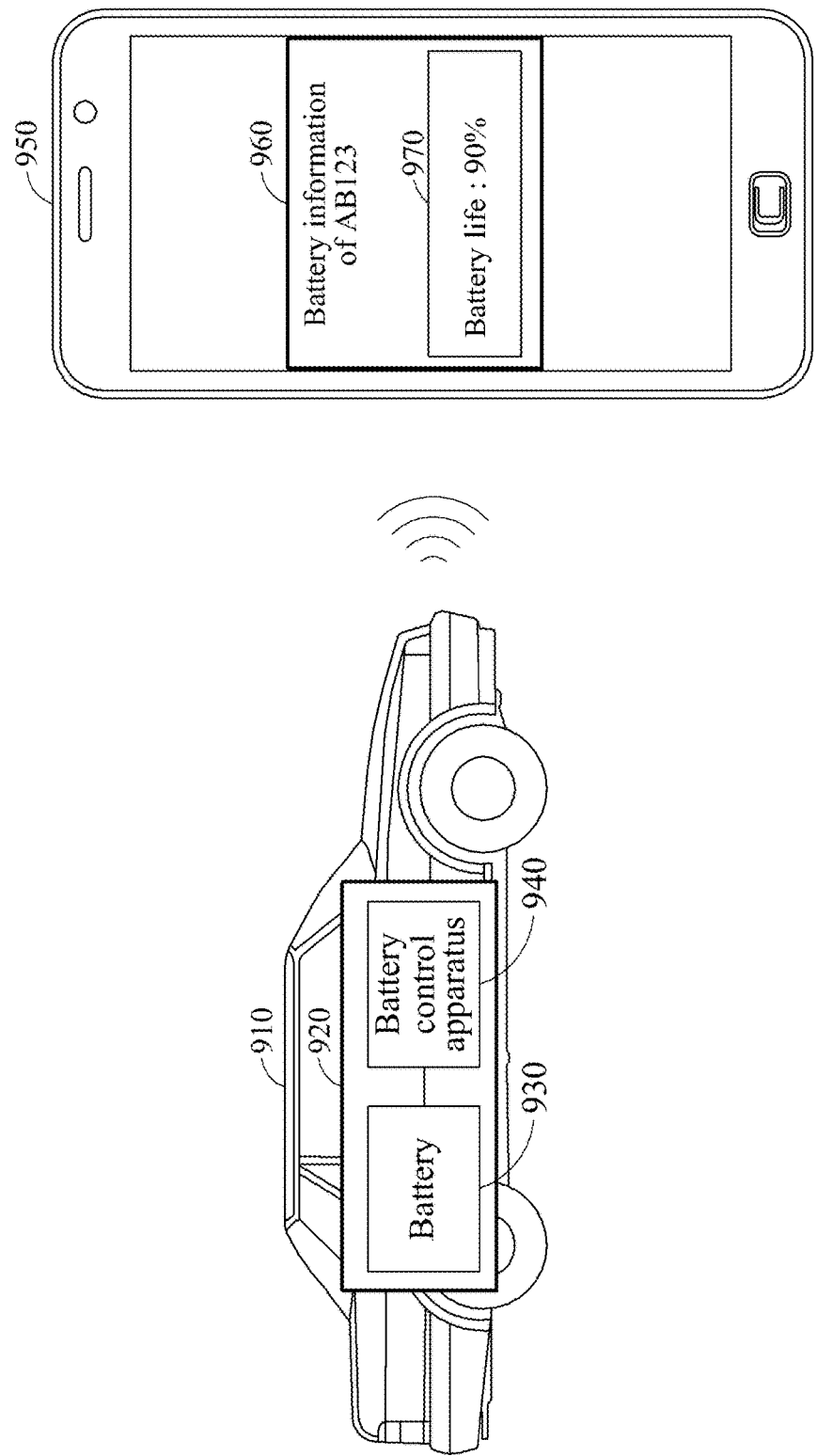
FIG. 9 illustrates an example of a user interface to provide battery life information.

FIG. 9 illustrates an example of a user interface to provide battery life information.

Referring to FIG. 9, an EV 910 includes a battery system 920. The battery system 920 includes a battery 930, and a battery control apparatus 940. The battery control apparatus 940 estimates a life of the battery 930 and transmits the life of the battery 930 to a terminal 950 using a wireless interface.

In one example, the battery control apparatus 940 receives a trigger signal from the terminal 950 via the wireless interface, and estimates the life of the battery 930 in response to the trigger signal. The battery control apparatus 940 transmits the estimated life to the terminal 950 using the wireless interface. The terminal 950 displays the estimated life 970 of the battery 930 using a user interface 960.

Figure 10:
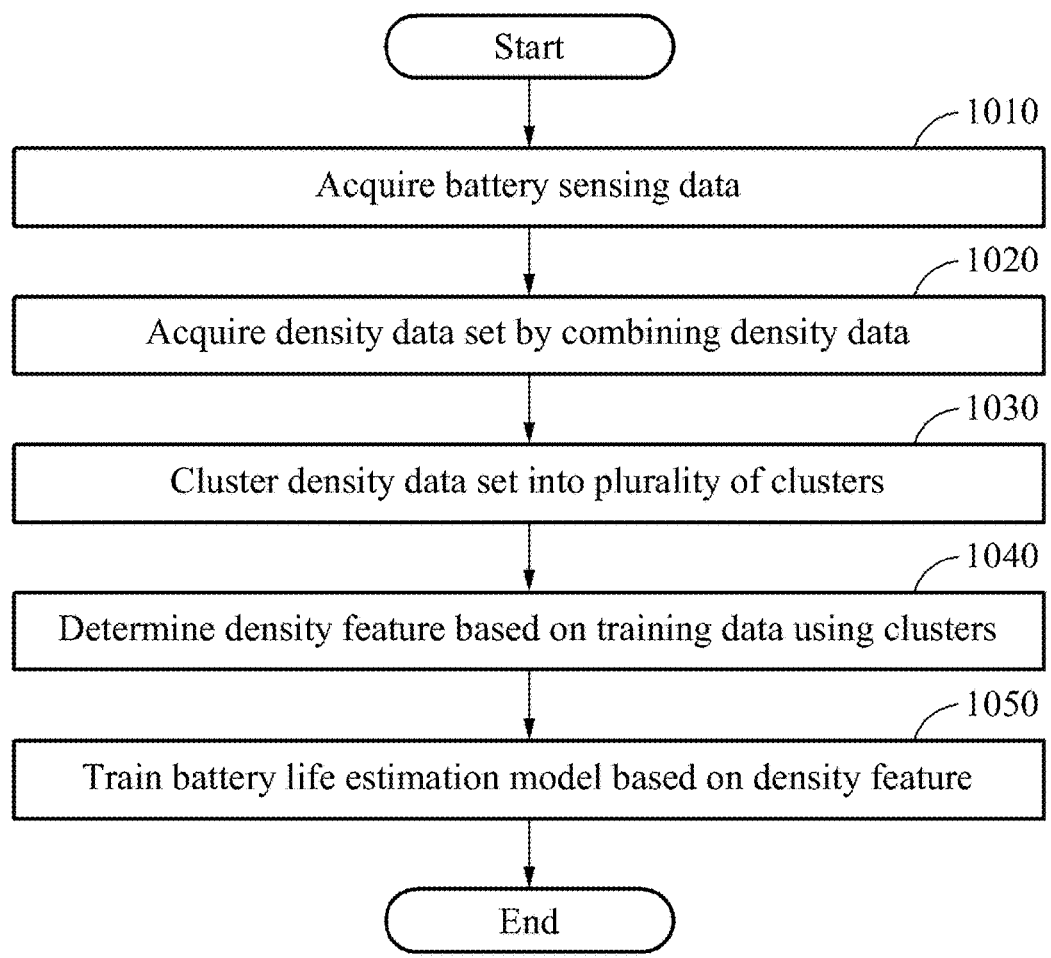
FIG. 10 is a flowchart illustrating an example of a method of training a battery life estimation model.

FIG. 10 is a flowchart illustrating an example of a method of training a battery life estimation model. The method of FIG. 10 is performed by, for example, the training apparatus 100 of FIG. 1.

Referring to FIG. 10, in operation 1010, the training apparatus 100 acquires battery sensing data. The training apparatus 100 collects different types of battery sensing data and generates density data based on the collected battery sensing data.

In operation 1020, the training apparatus 100 acquires a density data set by combining density data. The training apparatus 100 acquires density data based on various battery management profiles, and generates a density data set by combining the density data.

In operation 1030, the training apparatus 100 clusters the density data in the density data set into a plurality of clusters. The training apparatus 100 partitions a region represented by the density data set into a predetermined number of clusters, and stores information on the clusters. The training apparatus 100 normalizes a distribution of the density data set prior to the clustering.

In operation 1040, the training apparatus 100 determines a density feature based on training data using the clusters. The training apparatus 100 counts pieces of training data included in each of the clusters, quantifies a density pattern of the training data, and determines the density feature based on a quantification result.

In operation 1050, the training apparatus 100 trains the battery life estimation model based on the density feature. The training apparatus 100 trains the battery life estimation model using any of various machine learning schemes as described above, and stores information on the clusters and information on the trained battery life estimation model as a result of the training.

The description of FIGS. 1, 4, 5, 6, 7A and 7B above is also applicable to the method of FIG. 10, and accordingly is not repeated here.

Figure 11:
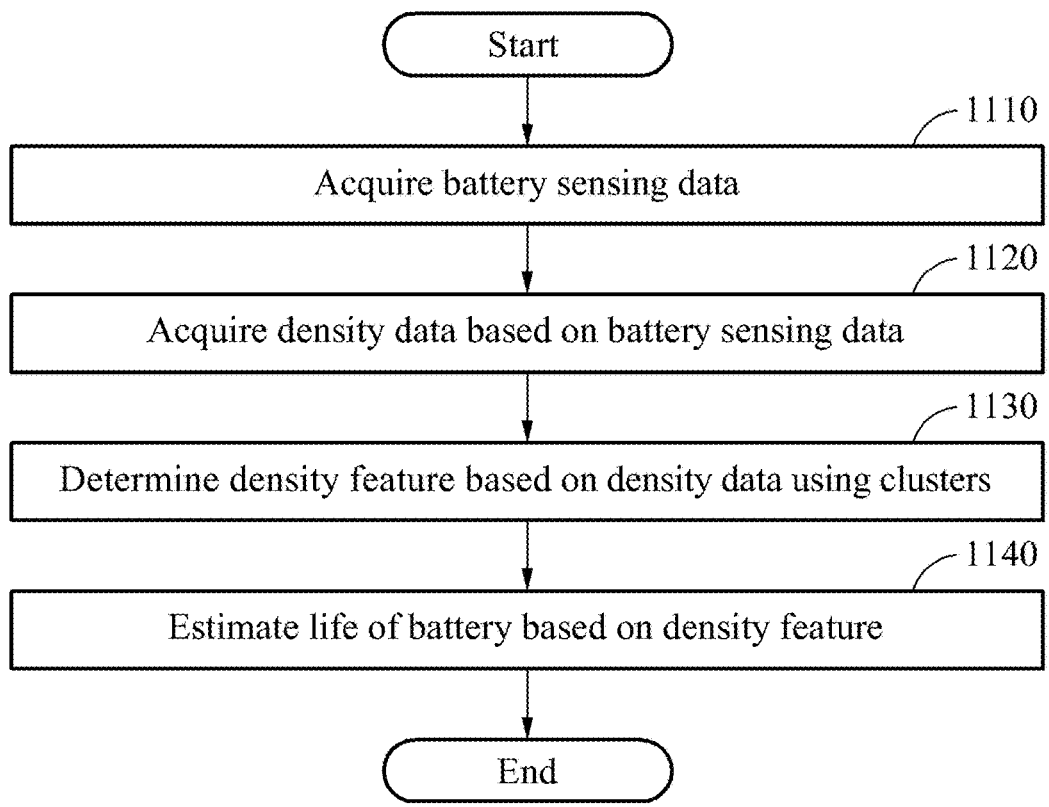
FIG. 11 is a flowchart illustrating an example of a method of estimating a life of a battery.

FIG. 11 is a flowchart illustrating an example of a method of estimating a life of a battery. The method of FIG. 11 is performed by, for example, the battery life estimation apparatus 230 of FIG. 2.

Referring to FIG. 11, in operation 1110, the battery life estimation apparatus 230 acquires battery sensing data. The battery life estimation apparatus 230 acquires sensing data, for example, voltage data, current data, and temperature data of the battery.

In operation 1120, the battery life estimation apparatus 230 acquires density data based on the battery sensing data. For example, the battery life estimation apparatus 230 combines different types of battery sensing data, and acquires density data by accumulating the combined battery sensing data over time.

In operation 1130, the battery life estimation apparatus 230 determines a density feature based on the density data using clusters. The battery life estimation apparatus 230 quantifies a density pattern of the density data based on cluster information determined during training of a battery life estimation model. The battery life estimation apparatus 230 converts the density data to a density vector as a density feature. The battery life estimation apparatus 230 counts pieces of density data included in each of the clusters, and determines a density vector as a density feature based on count values obtained by the counting for each of the clusters.

In operation 1140, the battery life estimation apparatus 230 estimates the life of the battery based on the density feature. The battery life estimation apparatus 230 inputs the density feature to a trained battery life estimation model, which estimates a current life of the battery.

The description of FIGS. 2, 3, 4, 5, 7A, 7B, 8, and 9 above is also applicable to the method of FIG. 11, and accordingly is not repeated here.

The training apparatus 100, density data set acquirer 110, the clusterer 120, the density feature determiner 130, and the battery life estimation model trainer 140 illustrated in FIG. 1, the battery life estimation apparatus 230, the density data acquirer 240, the density feature determiner 250, and the battery life estimator 260 illustrated in FIG. 2, the battery control apparatus 310, the battery life estimation apparatus 320, the storage 322, the density feature determiner 324, the battery life estimator 326, the buffer 350, the real time clock (RTC) 360, and the interface 370 illustrated in FIG. 3, the user interface 810 and the interface 820 illustrated in FIG. 8, and the battery control apparatus 940, the terminal 950, and the user interface 960 illustrated in FIG. 9 that perform the operations described herein with respect to FIGS. 1-11 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-11. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 10 and 11 that perform the operations described herein with respect to FIGS. 1-11 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented method of estimating a life of a battery, the method comprising:
   acquiring a density data set based on battery sensing data of battery management profiles;
   clustering the density data set into a plurality of clusters based on the battery management profiles;
   determining, based on a corresponding centroid of each of the plurality of cluster, respective quantities of pieces of the density data set included in each of the plurality of clusters;
   determining a density feature based on the determined respective quantities of the pieces included in each of the plurality of clusters; and
   estimating the life of the battery based on the density feature.

2. The method of claim 1, wherein the determining of the density feature based on the determined respective quantities of the pieces included in each of the plurality of clusters comprises:
   generating a histogram based on the determined respective quantities of the pieces included in each of the plurality of clusters; and
   determining, based on the generated histogram, a density vector to be the determined density feature.

3. The method of claim 1, wherein the determining of the density feature comprises converting the density data to a density vector based on the plurality of clusters.

4. The method of claim 1, wherein the acquiring comprises:
   combining different types of battery sensing data sensed at a same point in time; and
   acquiring the density data by accumulating the combined battery sensing data over time.

5. The method of claim 1, wherein the density data is data representing a spatial distribution with respect to different types of the battery sensing data over time.

6. The method of claim 5,
   wherein the acquiring includes normalizing the different types of the battery sensing data to generate a normalized data set,
   wherein the clustering comprises clustering the normalized data set into the plurality of clusters.

7. The method of claim 1, wherein the battery sensing data comprises any one or any combination of any two or more of voltage data, current data, and temperature data of the battery.

8. The method of claim 1, wherein the density data set is a combination of density data based on the plurality of battery management profiles.

9. The method of claim 1, wherein the estimating of the life of the battery based on the density feature comprises estimating the life of the battery from the density feature using a battery life estimation model provided the density feature; and
   the battery life estimation model is any one of a neural network (NN) model, a support vector machine (SVM) model, and a Gaussian process regression (GPR) model.

10. A non-transitory computer-readable storage medium storing instructions that, when executed by one or more processors, cause the one or more processors to perform the method of claim 1.

11. A processor-implemented method of training a battery life estimation model, the method comprising:
   acquiring a density data set by combining training density data acquired based on battery sensing data;
   clustering the training density data in the density data set into a plurality of clusters;
   determining, based on a corresponding centroid of each of the plurality of clusters, respective quantities of pieces of the training density data included in each of the plurality of clusters;
   determining a density feature based on the determined respective quantities of the pieces included in each of the plurality of clusters; and
   training the battery life estimation model based on the density feature.

12. The method of claim 11, wherein the determining of the density feature based on the determined respective quantities of the pieces included in each of the plurality of clusters comprises:
   generating a histogram based on the determined respective quantities of the pieces included in each of the plurality of clusters; and
   determining, based on the generated histogram, a density vector to be the determined density feature.

13. The method of claim 11, further comprising storing information of the plurality of clusters and information of the trained battery life estimation model.

14. The method of claim 11,
wherein the acquiring includes normalizing the combined battery sensing data to generate a normalized density data set, and
wherein the clustering comprises clustering the training density data in the normalized density data set into the plurality of clusters.

15. The method of claim 11, wherein the acquiring comprises:
acquiring the training density data based on a plurality of battery management profiles; and
acquiring the density data set by combining the acquired training density data.

16. The method of claim 11, wherein the acquiring comprises:
combining different types of battery sensing data sensed at a same point in time; and
accumulating the combined battery sensing data over time.

17. The method of claim 11, wherein:
the acquired training density data corresponds to usage of one or more batteries in predetermined battery usage environments; and
the training data is acquired based on battery sensing data measured during a predetermined time interval.

18. An apparatus for estimating a life of a battery, the apparatus comprising:
one or more processors configured to:
acquire battery sensing data;
convert the battery sensing data into density data indicating a density distribution of the battery sensing data in a space having a predetermined dimension;
cluster the density data into a plurality of clusters in the space based on a plurality of battery management profiles;
determine, based on a result of the clustering, respective total numbers of pieces of the density data in each of the plurality of clusters;
determine a density vector based on the determined respective total numbers of the pieces in each of the plurality of clusters; and
estimate the life of the battery based on the density vector,
wherein a cluster of the plurality of clusters contains all pieces of the density data that are closer to a centroid of the cluster than to a centroid of all other cluster of the plurality of clusters.

19. The apparatus of claim 18, wherein, for the conversion of the battery sensing data, the one or more processors are configured to project the battery sensing data onto the space having plural dimensions, with respect to different types of battery sensing data, to obtain the density data.

20. The apparatus of claim 19, wherein the one or more processors are configured to acquire the battery sensing data over a period of time;
the battery sensing data comprises N types of battery data sensed from the battery;
the space is an N-dimensional space; and
each of the N types of battery data is projected onto to a corresponding dimension of the N-dimensional space.

21. The apparatus of claim 18, wherein the density vector comprises elements respectively corresponding to the plurality of clusters; and
the elements are, respectively, the respective total numbers of the pieces of the density data in each of the plurality of clusters.

22. The apparatus of claim 18, further comprising a memory storing instructions that, when executed by the one or more processors, configure the one or more processors to perform the acquiring, the converting, the clustering, the determining of the respective total numbers of pieces in each of the plurality of clusters, the determining of the density vector, and the estimating of the life of the battery based on the density vector by implementing an estimation model considering the density vector.

* * * * *